United States Patent
Saeidi et al.

(10) Patent No.: US 10,159,165 B2
(45) Date of Patent: Dec. 18, 2018

(54) EVAPORATIVE COOLING SOLUTION FOR HANDHELD ELECTRONIC DEVICES

(71) Applicant: QUALCOMM Incorporated, San Diego, CA (US)

(72) Inventors: Mehdi Saeidi, San Diego, CA (US); Ali Akbar Merrikh, Austin, TX (US); Melika Roshandell, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/423,474

(22) Filed: Feb. 2, 2017

(65) Prior Publication Data

US 2018/0220553 A1 Aug. 2, 2018

(51) Int. Cl.
*H05K 7/20* (2006.01)
*H01L 23/427* (2006.01)
(Continued)

(52) U.S. Cl.
CPC ......... *H05K 7/20309* (2013.01); *G06F 1/203* (2013.01); *H01L 23/427* (2013.01);
(Continued)

(58) Field of Classification Search
CPC . G06F 1/181–1/182; H05K 7/20218–7/20381;
(Continued)

(56) References Cited

U.S. PATENT DOCUMENTS 7,463,486 B1 12/2008 Hu
8,917,507 B2 * 12/2014 Nagasawa ............. H01L 23/427
165/80.4

(Continued)

FOREIGN PATENT DOCUMENTS

DE 202011101830 U1 8/2011
WO 2015037996 A1 3/2015
WO 2016006089 A1 1/2016

OTHER PUBLICATIONS

International Search Report and Written Opinion—PCT/US2018/015996—ISA/EPO—dated May 30, 2018.
(Continued)

*Primary Examiner* — Anthony M Haughton
*Assistant Examiner* — Razmeen Gafur
(74) *Attorney, Agent, or Firm* — Arent Fox LLP

(57) ABSTRACT

An apparatus and method of the disclosure provides a cooling mechanism for a handheld electronic device. The cooling mechanism includes a heat sink and an evaporative cooling mechanism. The evaporative cooling mechanism includes liquid retaining structures. The liquid retaining structures are located in proximity to the at least one IC of the handheld electronic device. Each liquid retaining structure is coated with a temperature sensitive polymer that act as hydrophilic when the temperature of the surface of the handheld electronic device is below a threshold temperature. To maintain the temperature of the surface of the handheld electronic device below the threshold temperature, the temperature sensitive polymer act as hydrophobic and evaporates the liquid stored in the liquid retaining structures to the atmosphere surrounding the handheld electronic device when the temperature of the surface of the electronic device is above the threshold temperature.

29 Claims, 6 Drawing Sheets

(51) Int. Cl.
*G06F 1/20* (2006.01)
*H01L 23/473* (2006.01)
*H05K 1/02* (2006.01)

(52) U.S. Cl.
CPC ..... *H05K 7/20327* (2013.01); *H05K 7/20409* (2013.01); *G06F 2200/201* (2013.01); *H05K 1/0209* (2013.01); *H05K 2201/0323* (2013.01)

(58) Field of Classification Search
CPC ............... H05K 7/20409–7/20418; H05K 7/20009–7/202; H05K 7/20309; H05K 7/20327; H01L 23/367–23/3677; H01L 23/473; H01L 23/46–23/467; H01L 23/427
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 9,301,423 B2 | 3/2016 | Savelli et al. | |
| 9,343,436 B2 | 5/2016 | Hsiao et al. | |
| 2003/0150604 A1* | 8/2003 | Koning | F28F 13/00 165/185 |
| 2004/0052049 A1* | 3/2004 | Wu | F28D 15/0266 361/699 |
| 2005/0161198 A1* | 7/2005 | Makino | F28D 15/043 165/104.26 |
| 2006/0214177 A1* | 9/2006 | Jones | F21V 29/30 257/99 |
| 2007/0056714 A1* | 3/2007 | Wong | F28D 15/0233 165/104.26 |
| 2007/0095507 A1* | 5/2007 | Henderson | F28D 15/043 165/104.26 |
| 2007/0109740 A1* | 5/2007 | Drapeau | G06F 1/20 361/679.48 |
| 2007/0127210 A1* | 6/2007 | Mahalingam | G06F 1/20 361/700 |
| 2007/0256810 A1* | 11/2007 | Di Stefano | H01L 23/473 165/46 |
| 2008/0043440 A1* | 2/2008 | Fedorov | H01L 23/427 361/700 |
| 2008/0218970 A1* | 9/2008 | Kehret | H05K 7/1434 361/699 |
| 2009/0086439 A1* | 4/2009 | Whitton | H01L 23/552 361/720 |
| 2009/0213546 A1* | 8/2009 | Hassani | H01L 23/3677 361/702 |
| 2009/0262495 A1* | 10/2009 | Neudorfer | G06F 1/20 361/679.47 |
| 2010/0212348 A1* | 8/2010 | Oh | B01D 5/0006 62/291 |
| 2011/0056674 A1* | 3/2011 | Campbell | H05K 7/2079 165/247 |
| 2011/0075377 A1* | 3/2011 | Paquette | H05K 7/20509 361/709 |
| 2011/0198059 A1* | 8/2011 | Gavillet | F28D 15/046 165/104.26 |
| 2011/0228482 A1* | 9/2011 | Schmidt | H01L 23/367 361/705 |
| 2011/0279978 A1* | 11/2011 | Yoshikawa | H01L 23/427 361/700 |
| 2012/0027045 A1* | 2/2012 | McLellan | G01K 3/04 374/160 |
| 2012/0033385 A1* | 2/2012 | Nagasawa | H01L 23/427 361/721 |
| 2012/0087088 A1* | 4/2012 | Killion | F28D 15/0266 361/697 |
| 2013/0044432 A1* | 2/2013 | Ogata | H05K 7/20336 361/700 |
| 2013/0049041 A1* | 2/2013 | Ramer | H01L 31/024 257/98 |
| 2014/0119035 A1* | 5/2014 | Van Bommel | H01L 33/645 362/382 |
| 2014/0133101 A1* | 5/2014 | Sunaga | G06F 1/20 361/699 |
| 2014/0233186 A1* | 8/2014 | Savelli | H01L 23/34 361/699 |
| 2015/0021755 A1* | 1/2015 | Hsiao | H01L 25/0657 257/714 |
| 2015/0055299 A1* | 2/2015 | Arvelo | H01L 23/34 361/699 |
| 2015/0062804 A1* | 3/2015 | Campbell | H05K 7/2029 361/679.47 |
| 2015/0138723 A1* | 5/2015 | Shedd | H05K 7/20809 361/679.47 |
| 2015/0208550 A1* | 7/2015 | Rugg | H05K 7/20518 361/713 |
| 2015/0285539 A1* | 10/2015 | Kopko | F25B 5/02 62/115 |
| 2015/0354901 A1* | 12/2015 | Moore | H01L 23/427 165/104.21 |
| 2015/0382498 A1* | 12/2015 | Arnouse | G06F 11/2023 714/10 |
| 2015/0382509 A1* | 12/2015 | Nagata | H01L 25/072 361/710 |
| 2016/0048180 A1* | 2/2016 | Woo | G06F 1/206 361/679.48 |
| 2016/0056089 A1* | 2/2016 | Taniguchi | H01L 25/0657 257/714 |
| 2016/0120071 A1* | 4/2016 | Shedd | H05K 7/20772 361/679.47 |
| 2016/0128232 A1* | 5/2016 | Chainer | H01L 23/3735 361/700 |
| 2016/0131440 A1* | 5/2016 | Lee | F28D 15/0233 165/185 |
| 2016/0268931 A1* | 9/2016 | Aliane | C08L 1/284 |
| 2017/0017279 A1 | 1/2017 | Saeidi et al. | |
| 2017/0360167 A1* | 12/2017 | Nazzaro | A45C 11/00 |
| 2018/0039125 A1* | 2/2018 | Kubota | G06F 3/0412 |
| 2018/0080719 A1* | 3/2018 | Levy | F28D 15/06 |

OTHER PUBLICATIONS

Kuwabara S., et al., "Water-Absorbing Characteristics of Acrylic Acid-Grafted Carboxymethyl Cellulose Synthesized by Photografting", Journal of Applied Polymer Science, Jun. 13, 1996, vol. 60, No. 11, XP055472507, ISSN: 00021-8995, DOI: 10.1002/(SICI)1097-4628(19960613)60:11.

* cited by examiner

EVAPORATIVE COOLING SOLUTION FOR HANDHELD ELECTRONIC DEVICES

FIELD

The present disclosure relates generally to thermal management of devices, and more particularly, to an evaporative cooling solution for electronic devices such as handheld electronic devices.

BACKGROUND

The external temperature of a handheld electronic device, for example, a smart phone, a smart watch, a virtual reality device, a tablet, etc., may be skin temperature limited for a user's comfort level and safety. In a handheld electronic device, the heat generated by the electronic chips located inside the handheld electronic device is distributed across the handheld electronic device's surface to reduce hot spots at the surface of the handheld electronic device. Natural convection is used to dissipate the heat generated in the handheld electronic device to the ambient environment. However, in some cases, natural convection may not provide sufficient heat dissipation to maintain the surface temperature of the handheld electronic device at or below skin temperature without impacting the performance of the handheld electronic device, e.g., due to reducing clock rate to reduce heat generation in the handheld electronic device. Therefore, there is a need for a cooling mechanism for a handheld electronic device which may be used in conjunction with natural convection to provide additional cooling capacity during an extended high power operation of the handheld electronic device that may maintain the handheld electronic device's surface temperature at or below skin temperature for a longer period of time before device performance is reduced. In particular, there is a need for a cooling technique that may increase the power envelope of a handheld electronic device by providing increased cooling capability for thermal mitigation for extended high power operation.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In a handheld electronic device, the heat generated by the electronic chips located inside the handheld electronic device is distributed across the handheld electronic device's surface to reduce hot spots at the surface of the handheld electronic device. Natural convection is used to dissipate the heat generated in the handheld electronic device to the ambient environment. However, in some cases, natural convection may not provide sufficient heat dissipation to maintain the surface temperature of the handheld electronic device at or below skin temperature without impacting the performance of the handheld electronic device. In an aspect, an evaporative cooling mechanism for the handheld electronic device which may be used in conjunction with natural convection is provided. The evaporative cooling mechanism is used to provide additional cooling capacity during an extended high power operation of the handheld electronic device that may maintain the handheld electronic device's surface temperature at or below skin temperature for a longer period of time before device performance is reduced.

In an aspect of the disclosure, an electronic device, e.g., a handheld electronic device, is provided. The electronic device includes at least one integrated circuit (IC). The at least one IC is located between a first surface and a second surface and between a first side and a second side of the electronic device. The electronic device also includes a cooling mechanism. The cooling mechanism includes a heat sink. The heat sink extends in a first direction between the first side and the second side of the electronic device. A first side of the heat sink is adjacent to the second surface of the electronic device and a second side of the heat sink is in proximity to the at least one IC. The heat sink distributes heat generated from the at least one IC across the second surface of the electronic device to maintain temperature of the first surface and the second surface of the electronic device below a threshold temperature. The cooling mechanism also includes an evaporative cooling mechanism. The evaporative cooling mechanism includes a plurality of liquid retaining structures. The plurality of liquid retaining structures extend in parallel to each other in a second direction. The second direction is perpendicular to the first direction. The plurality of liquid retaining structures are located in proximity to the at least one IC on the second surface of the electronic device. Each liquid retaining structure of the plurality of liquid retaining structures is coated with a temperature sensitive polymer. In an aspect, the temperature sensitive polymer is hydrophilic and absorbs liquid from atmosphere surrounding the electronic device to store the absorbed liquid in the plurality of liquid retaining structures when the temperature of the second surface is below the threshold temperature. In another aspect, the temperature sensitive polymer is hydrophobic and repels the liquid stored in the plurality of liquid retaining structures when the temperature of the second surface exceeds the threshold temperature. In an aspect, to maintain the temperature of the first surface and the second surface of the electronic device below the threshold temperature, the evaporative cooling mechanism evaporates the liquid stored in the plurality of liquid retaining structures to the atmosphere surrounding the electronic device, when the temperature of the second surface exceeds the threshold temperature.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of cooling systems for electronic devices, e.g., handheld electronic devices, will now be presented with reference to various apparatus and methods. These apparatus and methods will be described in the following detailed description and illustrated in the accompanying drawings by various blocks, components, circuits, processes, etc. (collectively referred to as "elements"). These elements may be implemented using electronic hardware, computer software, or any combination thereof. Whether such elements are implemented as hardware or software depends upon the particular application and design constraints imposed on the overall system.

Figure 1:
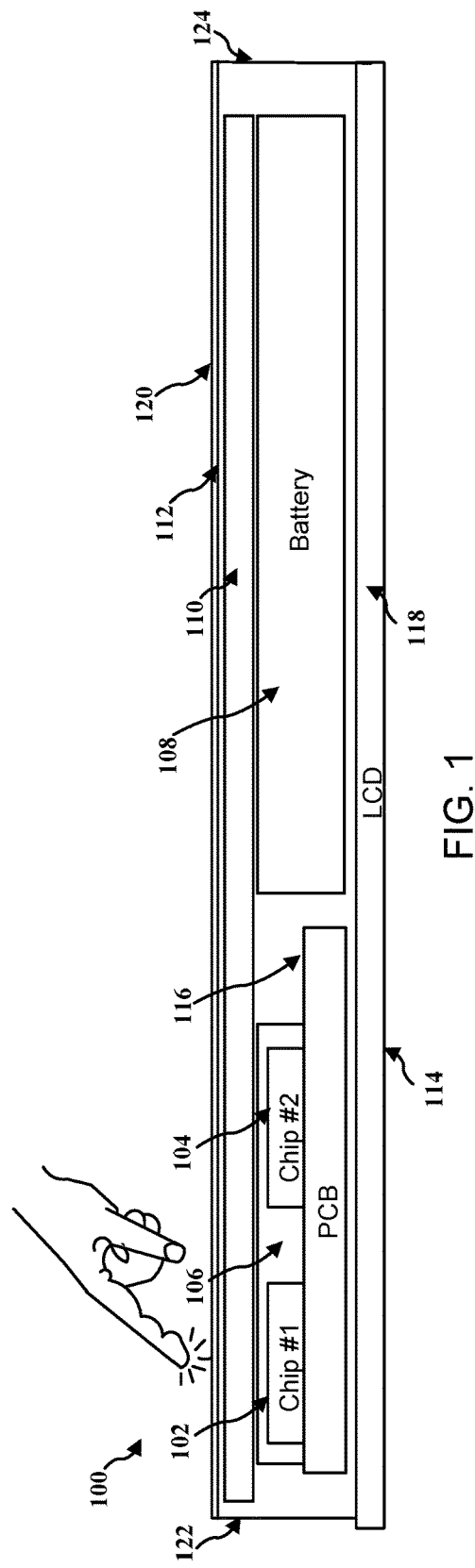
FIG. 1 is a diagram illustrating a handheld electronic device.

FIG. 1 illustrates a handheld electronic device 100. The handheld electronic device 100 may be a smart phone, a smart watch, a virtual reality device, a tablet, etc. The handheld electronic device 100 may include a first surface 114 (e.g., a front surface) and a second surface 112 (e.g., a back surface). A liquid crystal display (LCD) 118 may be embedded in the first surface 114 of the handheld electronic device 100. The second surface 112 of the handheld electronic device 100 may be covered with a cover 120 made of plastic, glass, metal, or the like. The handheld electronic device 100 may also include a printed circuit board (PCB) 116 extending in a first direction and may be located between the LCD 118 and the second surface 112 and between a first side 122 and a second side 124 of the handheld electronic device 100. A first side of the PCB 116 may be adjacent to the LCD 118. The handheld electronic device 100 may also include one or more ICs or chips. For example, a first electronic chip 102 and a second electronic chip 104 may be embedded on a second side of the PCB 116. The first electronic chip 102 and the second electronic chip 104 may be enclosed within an enclosure 106 located on the second side of the PCB 116. The handheld electronic device 100 may further include a battery 108 extending in the first direction and may be located between the LCD 118 and the second surface 112, and between the PCB 116 and the second side 124 of the handheld electronic device 100. A first side of the battery 108 may be adjacent to the LCD 118. The handheld electronic device 100 may additionally include a heat sink 110 (e.g., graphite sheets, thermal interface material, etc.) extending in the first direction between the first side 122 and the second side 124 of the handheld electronic device 100. A first side of the heat sink 110 may be adjacent to the second surface 112 and a second side of the heat sink 110 may be adjacent to the enclosure 106 and a second side of the battery 108.

The first electronic chip 102 and the second electronic chip 104 may generate heat during operation. The heat generated from the first electronic chip 102 and the second electronic chip 104 located inside the handheld electronic device 100 may be distributed across the handheld electronic device's 100 surface (114, 112) to reduce hot spots at the surface 114 of the LCD 118 and/or the cover 120 of the handheld electronic device 100. For example, the heat sink 110 may spread the heat generated from the first electronic chip 102 and the second electronic chip 104 across the second surface 112 of the handheld electronic device 100 to reduce hot spots at the surface 114 of the LCD 118 and/or the cover 120 of the handheld electronic device 100. Natural convection may be used to dissipate the heat generated inside the handheld electronic device 100 into the ambient environment surrounding the handheld electronic device 100. Natural convection may depend on the ambient temperature. The cooling capacity of natural convection may be represented as follows:

Natural convection to air=$f(T_{amb}, h_{convection})$, where $T_{amb}$ is the ambient temperature and $h_{convection}$ is the convection coefficient.

However, during an extended high power operation of the handheld electronic device 100 (for example, during a video conference call, when capturing a video clip using a camera module of the handheld electronic device 100, etc.), the natural convection cooling mechanism may not maintain the desired surface temperature of the LCD 118 and/or the cover 120 of the handheld electronic device 100 at or below skin temperature without reducing the performance of the handheld electronic device 100 (e.g., by reducing the clock rate to reduce power dissipation/heat generation by various components in the handheld electronic device 100). Therefore, there is a need for a cooling mechanism for handheld electronic devices 100 which may be used in conjunction with the natural convection cooling mechanism to provide additional cooling capacity for a handheld electronic device 100 to maintain the surface temperature of the LCD 118 and/or the cover 120 of the handheld electronic device 100 at skin temperature during an extended higher power operation. In particular, there is a need for a cooling technique that may improve the cooling capability of a handheld electronic device 100 by increasing the power envelope of the handheld electronic device 100 and thermal mitigation during extended high power operation, e.g., an additional 5 to 10 minutes of higher power operation. The additional operating time at higher power may allow a video conference to be completed or a video clip to be captured with reducing device performance, e.g., reducing video frame rate or video resolution.

Figure 2A:
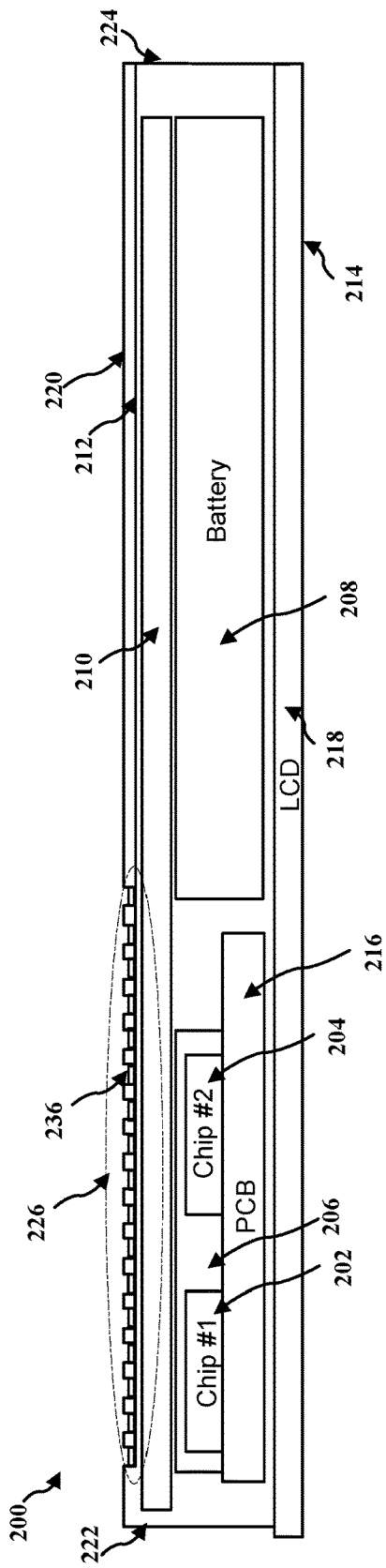
FIG. 2A is a diagram illustrating a plan view of a handheld electronic device with an evaporative cooling mechanism.
Figure 2C:
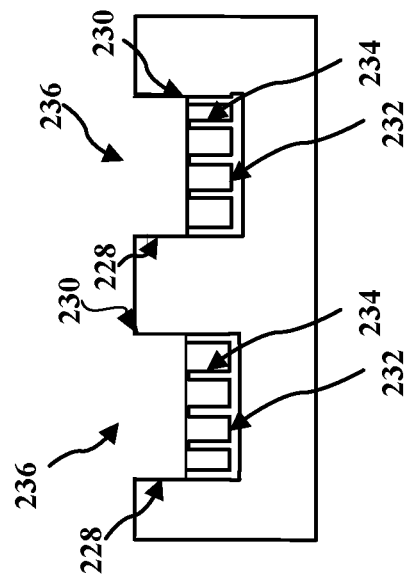
FIG. 2C is a diagram illustrating a plan view of another configuration of two consecutive parallel channels of the evaporative cooling mechanism of FIG. 2A.
Figure 2B:
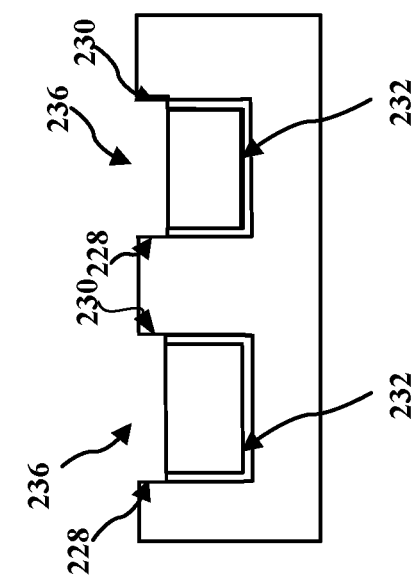
FIG. 2B is a diagram illustrating a plan view of a configuration of two consecutive parallel channels of the evaporative cooling mechanism of FIG. 2A.

FIG. 2A is a diagram illustrating a plan view of a handheld electronic device 200 with an evaporative cooling mechanism 226, according to an aspect. FIG. 2B is a diagram illustrating a plan view of a configuration with two consecutive parallel channels of the evaporative cooling mechanism 226, according to an aspect. FIG. 2C is an example diagram illustrating a plan view of another configuration of two consecutive parallel channels of the evaporative cooling mechanism 226, according to another aspect.

The handheld electronic device 200 may be the handheld electronic device discussed with respect to FIG. 1. The handheld electronic device 200 may be a smart phone, a smart watch, a virtual reality device, a tablet, etc. The handheld electronic device 200 may include a first surface 214 (e.g., a front surface) and a second surface 212 (e.g., a back surface). A LCD 218 may be embedded in the first surface 214 of the handheld electronic device 200. The second surface 212 of the handheld electronic device 200 may be covered with a cover 220 made of plastic, glass, metal, or the like. The handheld electronic device 200 may also include a PCB 216 extending in a first direction which may be located between the LCD 218 and the second surface 212 and between a first side 222 and a second side 224 of the handheld electronic device 200. A first side of the PCB 216 may be adjacent to the LCD 218. The handheld electronic device 200 may also include one or more ICs or chips. For example, a first electronic chip 202 and a second electronic chip 204 may be embedded on a second side of the PCB 216. The first electronic chip 202 and the second electronic chip 204 may be enclosed within an enclosure 206 located on the second side of the PCB 216. The handheld electronic device 200 may further include a battery 208 extending in the first direction and may be located between the LCD 218 and the second surface 212, and located between the PCB 216 and the second side 224 of the handheld electronic device 200. A first side of the battery 208 may be adjacent to the LCD 218. The handheld electronic device 200 may additionally include a heat sink 210 (e.g., graphite sheets) extending in the first direction between the first side 222 and the second side 224 of the handheld electronic device 200. A first side of the heat sink 210 may be adjacent to the second surface 212 and a second side of the heat sink 210 may be adjacent to the enclosure 206 and a second side of the battery 208.

The handheld electronic device 200 may further include an evaporative cooling mechanism 226 incorporated into the second surface 212 of the handheld electronic device 200. However, in some embodiments, the evaporative cooling mechanism 226 may be incorporated into the cover 220 of the handheld electronic device 200. The evaporative cooling mechanism 226 may include one or more micro-channels 236 extending in parallel to each other in a second direction, where the second direction is perpendicular to the first direction. In one embodiment, the one or more micro-channels 236 may cover the entire cover 220 of the handheld electronic device 200. In an aspect, as depicted in FIG. 2B, each micro-channel 236 of the one or more micro-channels may include a bottom surface 232 and two side surfaces (228, 230). The two side surfaces (228, 230) may be separated from each other via the bottom surface 232. The dimensions of each micro-channel 236 may be from a few microns to hundreds of microns (e.g., the depth/width of each micro-channel 236 may be in the range of 20 to 250 microns). The dimensions of each micro-channel 236 may be smaller or larger in other aspects depending on cooling capacity needed. In one embodiment, the length of each micro-channel 236 may be approximately equal to the width of the handheld electronic device 200. In one embodiment, the cooling capacity provided by the evaporative cooling mechanism 226 may depend on an amount of water stored in each micro-channel 236 of the one or more micro-channels, which may depend on the length and depth of the each micro-channel 236 of the one or more micro-channels. For example, the depth of each micro-channel 236 may be 100-250 microns. The length of each micro-channel 236 may be smaller or equal to the length or the width of the second surface 212 (e.g., a back surface) of the handheld electronic device 200. The length and depth of each micro-channel 236 may be small or larger in other embodiments depending on the desired amount of cooling capacity needed.

The bottom surface 232 of each micro-channel 236 may be coated with a temperature sensitive polymer having a surface property that changes based on temperature, switching between hydrophobic and hydrophilic (e.g., Poly(N-isopropylacrylamide) (PNIPAAm)). In an aspect, 50% to 75% of each of two side surfaces (228, 230) of each micro-channel 236 may be coated with the temperature sensitive polymer. The polymer may not extend all the way up the sides of each micro-channel 236 to prevent the second surface 212 or cover 220 of the handheld electronic device 200 from feeling wet when touched by a user of the handheld electronic device 200. In some aspects, the one or more micro-channels 236 on the cover 220 of the handheld electronic device 200 may be replaced with a plurality of cylinders where the bottom surface of each cylinder and half of the side surface of each cylinder are coated with the temperature sensitive polymer to implement the evaporative cooling and to prevent a user of the handheld electronic device 200 from feeling wet when touching the second surface 212 or cover 220 of the handheld electronic device 200. In some aspects, as shown in FIG. 2C, one or more fins 234 coated with the temperature sensitive polymer may be attached to the bottom surface 232 of each micro-channel 236 to increase the surface area of the temperature sensitive polymer coating exposed to the surrounding environment. The additional temperature sensitive polymer surface area may increase the water absorption and evaporation by each micro-channel 236. In one embodiment, the height of each fin 234 of the one or more fins is approximately equal to the height of the temperature sensitive polymer coating in the side surfaces 228, 230 of each micro-channel 236.

In one embodiment, the temperature sensitive polymer may be a simple sponge like cotton fabric which may collect and release water from the surrounding environment based on temperature variations of the handheld electronic device's 200 second surface 212. (e.g., a combination of cotton and Poly(N-isopropylacrylamide) (PNIPAAm)). In an aspect, the temperature sensitive polymer changes from hydrophilic below skin temperature to hydrophobic at or above skin temperature. Therefore, water may be absorbed from the surrounding environment and released (evaporates) into the surrounding environment depending on the temperature of the temperature sensitive polymer. For example, the temperature sensitive polymer may be hydrophilic when the temperature of the handheld electronic device 200 is below a threshold and may absorb water from surrounding environment (e.g., the atmosphere) of the handheld electronic device 200. The water may be stored in each micro-channel 236 coated with the temperature sensitive polymer by attaching to the surface of the temperature sensitive polymer. However, when the temperature of the handheld electronic device 200 is above the threshold, the temperature sensitive polymer may become hydrophobic and repel the absorbed water stored in each micro-channel 236. When the water is repelled by the temperature sensitive polymer, the water in each micro-channel 236 may evaporate to the atmosphere surrounding the handheld electronic device 200, thus cooling the handheld electronic device 200. The threshold temperature at which the surface property of the temperature sensitive polymer changes between hydrophilic and hydrophobic may be about 35 degree centigrade or skin temperature.

In an aspect, the first electronic chip 202 and the second electronic chip 204 of the handheld electronic device 200 may generate heat during operation. The heat generated from the first electronic chip 202 and the second electronic chip 204 located inside the handheld electronic device 200 may be distributed across the surface (e.g., the first surface 214) of the LCD 218 and/or the cover 220 of the handheld electronic device 200 to reduce hot spots at the surface (e.g., the first surface 214) of the LCD 218 and/or the cover 220 of the handheld electronic device 200. The heat sink 210 may be used to spread the heat generated from the first electronic chip 202 and the second electronic chip 204 across the second surface 212 of the handheld electronic device 200 to further reduce hot spots at the surface (e.g., the first surface 214) of the LCD 218 and/or the cover 220 of the handheld electronic device 200. Natural convection may be used to dissipate heat generated inside the handheld electronic device 200 into the ambient environment surrounding the handheld electronic device 200. The amount of cooling provided by natural convection may depend on the ambient temperature. In some embodiments, when the temperature of the surface (e.g., the first surface 214) of the LCD 218 and/or the cover 220 of the handheld electronic device 200 reaches the skin temperature, the performance of the first electronic chip 202 and/or the second electronic chip 204 of the handheld electronic device 200 may be reduced to reduce power consumption/heat generation to maintain the surface temperature of the LCD 218 and/or the cover 220 of the handheld electronic device 200 at or below skin temperature. In some cases, during an extended high power operation of the handheld electronic device 200, the natural convection cooling mechanism may not be enough to maintain the desired surface temperature of the LCD 218 and/or the cover 220 and to maintain the performance of the handheld electronic device 200.

In an aspect, during the extended high power operation of the handheld electronic device 200 (for example, during a video conference call or a capture of a video segment lasting 5 to 10 minutes, etc.), when the temperature of the surface (e.g., the first surface 214) of the LCD 218 and/or the cover 220 of the handheld electronic device 200 reaches the skin temperature, the evaporative cooling mechanism 226 may maintain the surface temperature of the LCD 218 and/or the cover 220 of the handheld electronic device 200 at or below the skin temperature by evaporating water stored in each micro-channel 236 of the one or more micro-channels incorporated into the second surface 212 of the handheld electronic device 200. For example, the temperature sensitive polymer covering the bottom surface 232 and the side surfaces 228 and 230 of each micro-channel 236 of the one or more micro-channels may be hydrophobic when the temperature of the handheld electronic device 200 is above the skin temperature and may repel the absorbed water stored in each micro-channel 236 of the one or more micro-channels. When the water is repelled by the bottom surface 232 and the side surfaces 228 and 230 of each micro-channel 236 of the one or more micro-channels coated with the temperature sensitive polymer, the water in each micro-channel 236 may evaporate into the atmosphere surrounding the handheld electronic device 200, thus in turn cool the handheld electronic device 200. As such, the performance of the handheld electronic device 200 may not be reduced during high power operation while there is water evaporation. Once the water in each micro-channel 236 of the one or more micro-channels is evaporated, the performance of the handheld electronic device 200 may be reduced to maintain the surface temperature of the LCD 218 and/or the cover 220 of the handheld electronic device 200 at or below skin temperature. Thus, by using the evaporative cooling mechanism 226, the handheld electronic device 200 may be operated at a higher power for a longer period of time.

Figure 3:
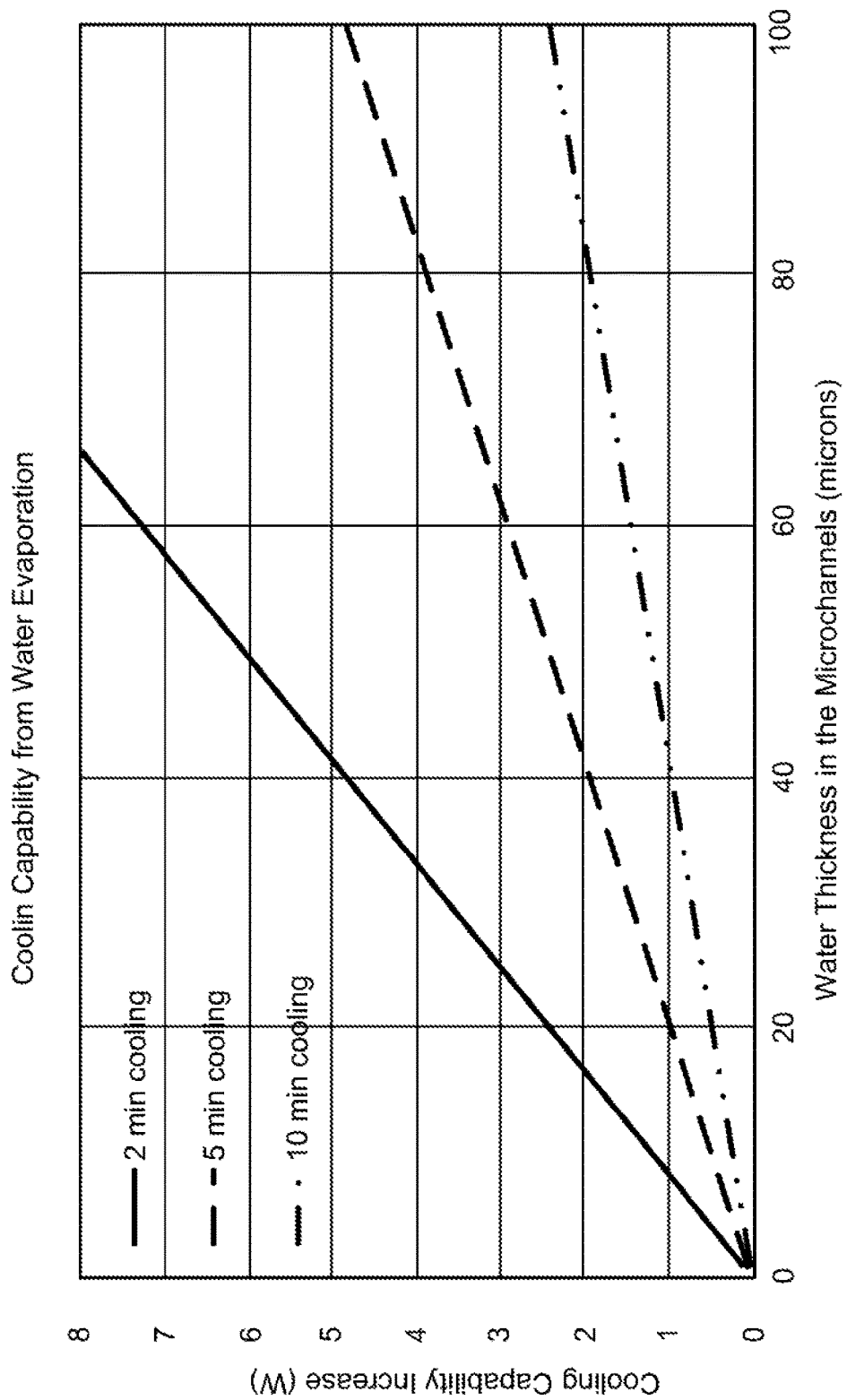
FIG. 3 is a diagram illustrating a graphical representation of the relationship between the depth of each channel or water thickness on each channel on the cover of the handheld electronic device and the power dissipated in Watts from the handheld electronic device.

FIG. 3 is a diagram illustrating a graphical representation of the relationship between the depth of each micro-channel 236 or water thickness in each micro-channel 236 incorporated into the second surface 212 or the cover 220 of the handheld electronic device 200 and the cooling capacity in Watts from the handheld electronic device 200. As discussed supra, the cooling capacity of the evaporative cooling mechanism 226 may depend on the amount of water stored in each micro-channel 236 of the one or more micro channels, which may depend on the length and depth of each micro-channel 236. The cooling capacity of the evaporative cooling mechanism 226 may also depend on the water evaporation rate, which may depend on the ambient temperature, the humidity of the air surrounding the handheld electronic device 200, the ambient air pressure, elevation, etc. For example, as shown in FIG. 3, in one embodiment, for a 20 micron thickness of water in the one or more micro-channels (236), 1 W extra cooling may be achieved for 5 min using the evaporative cooling mechanism 226. In another configuration, for a 40 micron thickness of water in the one or more micro-channels (236), 1 W extra cooling may be achieved for 10 min using the evaporative cooling mechanism 226. In some configurations, for a 20 micron thickness of water in the one or more micro-channels (236), 2.5 W extra cooling may be achieved for 2 min using the evaporative cooling mechanism 226. In some configurations, if the depth of each micro-channel 236 of the one or more micro channels is 30 micron and the width of each micro-channel 236 of the one or more micro channels is 60 micron, each micro-channel 236 may provide 1 W of additional cooling at 25° C. for 5 minutes with the evaporation rate of 0.3 Kg/hr/m$^2$.

Figure 4:
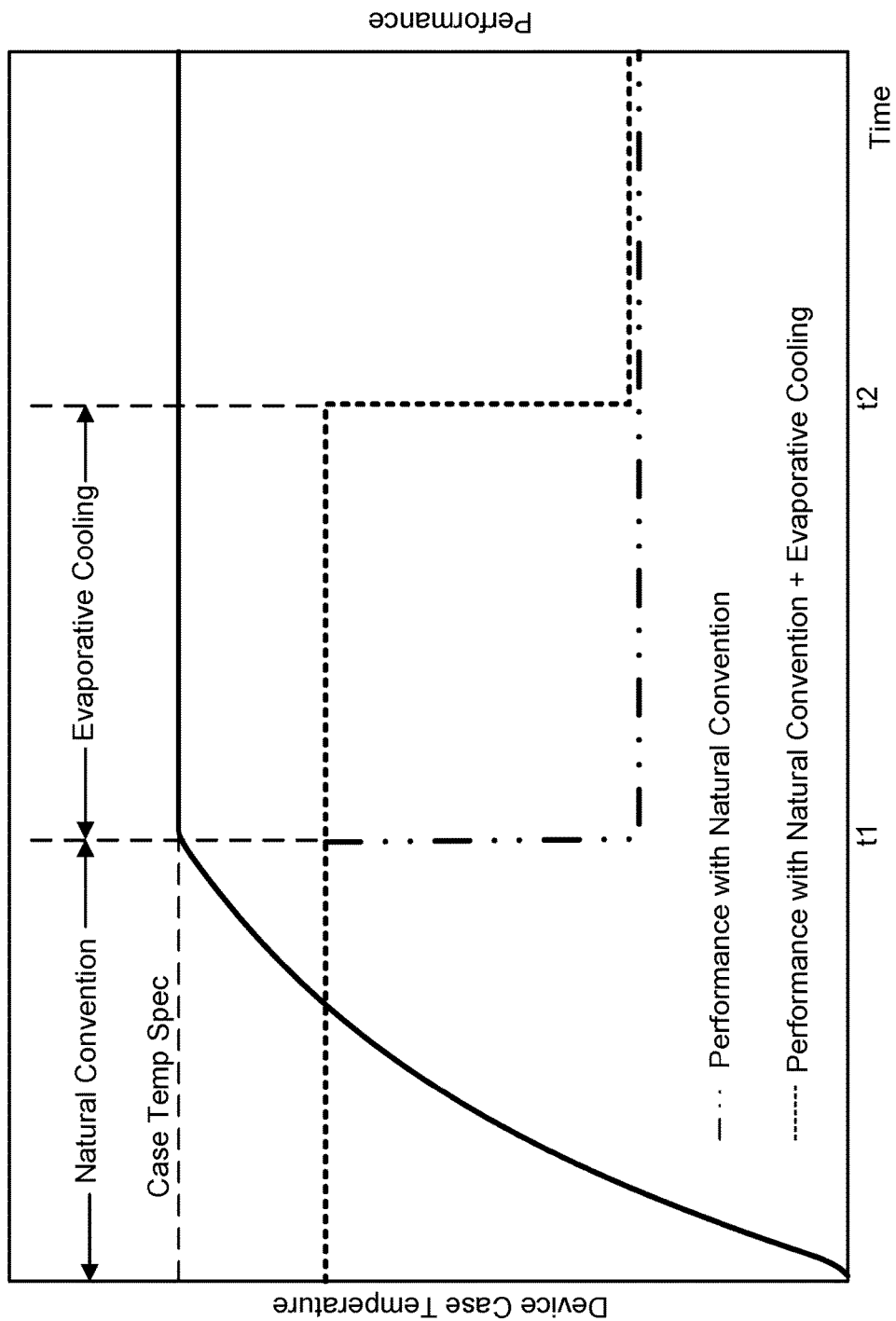
FIG. 4 is a diagram illustrating a graphical representation of an expected improvement in cooling of the handheld electronic device utilizing the evaporative cooling mechanism.

FIG. 4 is a diagram illustrating a graphical representation of an increase in cooling capacity of the handheld electronic device 200 utilizing the evaporative cooling mechanism 226 that may be provided according to an aspect. In FIG. 4, the solid line shows the temperature increase with time at the surface (e.g., the first surface 214) of the LCD 218 and/or the cover 220 of the handheld electronic device 200. As shown in FIG. 4, at t1, when the temperature of the surface (e.g., the first surface 214) of the LCD 218 and/or the cover 220 of the handheld electronic device 200 reaches the skin temperature, the performance of the first electronic chip 202 and the second electronic chip 204 of the handheld electronic device 200 may be reduced to reduce power and maintain the surface temperature of the LCD 218 and/or the cover 220 of the handheld electronic device 200 at or below skin temperature when cooling is provided by natural convention. However, with the evaporative cooling mechanism 226 in conjunction with the natural air convection, the performance of the handheld electronic device 200 may not be reduced during the additional cooling capacity provided by water evaporation. During the extended high power operation of the handheld electronic device 200 (for example, during a SKYPE call last 5 to 10 minutes, viewing a YOUTUBE video, etc.), at t1 when the temperature of the surface (e.g., the first surface 214) of the LCD 218 and/or the cover 220 of the handheld electronic device 200 reaches the skin temperature, the evaporative cooling mechanism 226 may maintain the surface temperature of the LCD 218 and/or the cover 220 of the handheld electronic device 200 at or below the skin temperature by evaporating the water stored in the plurality of micro-channels 236 incorporated into the second surface 212 or cover 220 of the handheld electronic device 200. The performance of the handheld electronic device 200 may not be reduced between t1 and t2, while additional cooling capacity is provided by water evaporation. Once the water in each micro-channel 236 of the one or more micro-channels is evaporated, at t2, the performance of the handheld electronic device 200 may be reduced to maintain the surface temperature of the LCD 218 and/or the cover 220 of the handheld electronic device 200 at or below skin temperature. Thus, by using the evaporative cooling mechanism 226, the handheld electronic device 200 may be operated at high power for a longer period (up to t2, which is greater than t1) of time. For example, in one configuration, as shown in FIG. 3, for a 20 micron thickness of water in the micro-channels (e.g., 236), 1 W extra cooling may be achieved for 5 min using the evaporative cooling mechanism 226. In another configuration, for a 40 micron thickness of water in the micro-channels (e.g., 236), 1 W extra cooling may be achieved for 10 min using the evaporative cooling mechanism 226. In some configurations, for a 20 micron thickness of water in the micro-channels (e.g., 236), 2.5 W extra cooling may be achieved for 2 min using the evaporative cooling mechanism 226.

Figure 5:
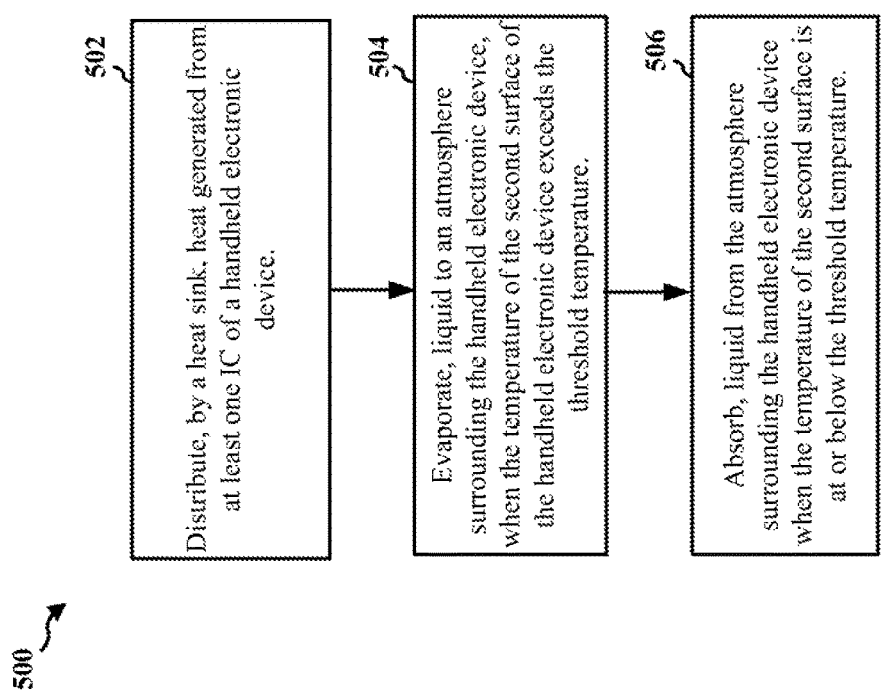
FIG. 5 is a flowchart of a method of cooling a handheld electronic device.

FIG. 5 is a flowchart 500 of a method of cooling a handheld electronic device. The handheld electronic device may be the handheld electronic device (100, 200) of FIGS. 1 and 2A. In one configuration, the flowchart 500 described in FIG. 5 may be the method of cooling a handheld electronic device (100, 200) described above with respect to FIGS. 1-2C.

At 502, heat generated from at least one IC (102, 202, 104, 204) of a handheld electronic device (100, 200) is distributed by a heat sink (110, 210). For example, as discussed with respect to FIGS. 1-2A, the heat sink (110, 210) may distribute the heat generated from the first electronic chip (102, 202) and the second electronic chip (104, 204) located inside the handheld electronic device (100, 200), across the surface (e.g., the first surface 114/214) of the LCD (118, 218) and/or the cover (120, 220) of the handheld electronic device (100, 200) to reduce hot spots at the surface (e.g., the first surface 114/214) of the LCD (118, 218) and/or the cover (120, 220) of the handheld electronic device (100, 200).

At 504, liquid is evaporated to the atmosphere surrounding the handheld electronic device (100, 200), when the temperature of the second surface (112, 212) of the handheld electronic device (100, 200) exceeds the threshold temperature. For example, as discussed with respect to FIGS. 2A-2C, when the temperature of the second surface (112, 212) of the handheld electronic device 200 reaches the skin temperature, the evaporative cooling mechanism 226 evaporates the water stored in the one or more micro-channels 236 incorporated into the second surface (112, 212) or the cover 220 of the handheld electronic device 200 to maintain the surface temperature of the LCD (118, 218) and/or the cover (120, 220) of the handheld electronic device 200 at or below the skin temperature. The evaporation of liquid continues until there is no more water to evaporate in the micro-channels 236. Once all the water in the micro-channels 236 are evaporated, then the device 200 performance is scaled back.

Next, at 506, when the temperature of the second surface (112, 212) of the handheld electronic device (100, 200) comes down at or below the threshold temperature, due to the evaporation of the liquid, liquid is absorbed from the atmosphere surrounding the handheld electronic device (100, 200) by the temperature sensitive polymer covering the bottom surface 232 and the side surfaces 228 and 230 of the one or more micro-channels (236) until the capacity of the temperature sensitive polymer is reached. For example, as discussed with respect to FIGS. 2A-2C, when the temperature of the second surface (112, 212) of the handheld electronic device (100, 200) is at or below the threshold temperature, water is absorbed from the atmosphere surrounding the handheld electronic device (100, 200) by the temperature sensitive polymer covering the bottom surface 232 and the side surfaces 228 and 230 of the one or more micro-channels (236) until the capacity of the temperature sensitive polymer is reached.

In an aspect, a handheld electronic device (100, 200) is provided. The handheld electronic device (100, 200) includes at least one IC (102, 202, 104, 204). The at least one IC (102, 202, 104, 204) is located between a first surface (114, 214) and a second surface (112, 212) and between a first side (122, 222) and a second side (124, 224) of the handheld electronic device (100, 200). The handheld electronic device (100, 200) also includes a cooling mechanism (110, 210, 226). The cooling mechanism (226) includes a heat sink (110, 210). The heat sink (110, 210) extends in a first direction between the first side (122, 222) and the second side (124, 224) of the handheld electronic device (100, 200). A first side of the heat sink (110, 210) is adjacent to the second surface (112, 212) of the handheld electronic device (100, 200). A second side of the heat sink (110, 210) is in proximity to the at least one IC (102, 104, 202, 204). The heat sink (110, 210) distributes the heat generated from the at least one IC (102, 202, 104, 204) across the second surface (112, 212) of the handheld electronic device (100, 200) to maintain temperature of the first surface (114, 214) and the second surface (112, 212) of the handheld electronic device below a threshold temperature. The cooling mechanism (110, 210, 226) also includes an evaporative cooling mechanism (226). The evaporative cooling mechanism (226) includes a plurality of liquid retaining structures (236). The plurality of liquid retaining structures (236) extend in parallel to each other in a second direction. The second direction is perpendicular to the first direction. The plurality of liquid retaining structures (236) are located in proximity to the at least one IC (102, 104, 202, 204) on the second surface (112, 212) of the handheld electronic device (100, 200). Each liquid retaining structure (236) of the plurality of liquid retaining structures (236) is coated with a temperature sensitive polymer. In an aspect, the temperature sensitive polymer is hydrophilic and absorbs liquid from an atmosphere surrounding the handheld electronic device (100, 200) to store the absorbed liquid in the plurality of liquid retaining structures (236) when the temperature of the second surface (112, 212) is below the threshold temperature. In another aspect, the temperature sensitive polymer is hydrophobic and repels the liquid stored in the plurality of liquid retaining structures (236) when the temperature of the second surface (112, 212) exceeds the threshold temperature. In an aspect, to maintain the temperature of the first surface (114, 214) and the second surface (112, 212) of the handheld electronic device (100, 200) below the threshold temperature, the evaporative cooling mechanism (226) evaporates the liquid stored in the plurality of liquid retaining structures (236) to the atmosphere surrounding the handheld electronic device (100, 200), when the temperature of the second surface (112, 212) exceeds the threshold temperature.

In one configuration, the liquid retaining structure (236) is a channel (236) that includes a bottom surface (232) and two side surfaces (228, 230). The two side surfaces (228, 230) are separated from each other via the bottom surface (232).

The bottom (232) surface of the channel (236) and half or three fourth of each of the two side surfaces (228, 230) of the channel (236) are coated with the temperature sensitive polymer. In an aspect, the threshold temperature is 35 degree centigrade. In another aspect, a dimension of the channel (236) ranges from few microns to hundreds of microns. In one configuration, a cooling capacity provided by the evaporative cooling mechanism (226) depends on an amount of water stored in the plurality of liquid retaining structures (236). In another configuration, the amount of water stored in the plurality of liquid retaining structures (236) depend on depth of each of the plurality of liquid retaining structures (236). In an aspect, one or more fins (234) coated with the temperature sensitive polymer are attached to the bottom surface (232) of the channel (236). In a configuration, a height of each fin (234) of the one or more fins (234) is approximately equal to the height of the temperature sensitive polymer coating in the two side surfaces (228, 230) of the channel (236). In an aspect, the handheld electronic device (100, 200) is one of a smart phone, a smart watch, a virtual reality device, a tablet. In another aspect, the temperature sensitive polymer is a combination of cotton and Poly(N-isopropylacrylamide) (PNIPAAm). In a configuration, the liquid is water. In another configuration, each of the plurality of liquid retaining structure (236) is an open cylinder that includes a bottom surface and a side surface, wherein the bottom surface and half of the side surface of the open cylinder are coated with the temperature sensitive polymer.

In an aspect, a method of cooling a handheld electronic device (100, 200) is provided. The method of cooling includes distributing, by a heat sink (110, 210), heat generated from at least one IC (102, 202, 104, 204) located between a first surface (114, 214) and a second surface (112, 212) and between a first side (122, 222) and a second side (124, 224) of the handheld electronic device (100, 200). The heat generated from the at least one IC (102, 202, 104, 204) is distributed across the second surface (112, 212) of the handheld electronic device (100, 200) to maintain temperature of the first surface (114, 214) and the second surface (112, 212) of the handheld electronic device (100, 200) below a threshold temperature. The heat sink (110, 210) extends in a first direction between the first side (122, 222) and the second side (124, 224) of the handheld electronic device (100, 200). A first side of the heat sink (110, 210) is adjacent to the second surface (112, 212) of the handheld electronic device (100, 200) and a second side of the heat sink (110, 210) is in proximity to the at least one IC (102, 202, 104, 204). The method of cooling also includes evaporating liquid to an atmosphere surrounding the handheld electronic device (100, 200), when the temperature of the second surface (112, 212) of the handheld electronic device (100, 200) exceeds the threshold temperature. The liquid is evaporated to maintain the temperature of the first surface (114, 214) and the second surface (112, 212) of the handheld electronic device (100, 200) below the threshold temperature. The method of cooling further includes absorbing liquid from the atmosphere surrounding the handheld electronic device (100, 200) when the temperature of the second surface (112, 212) is at or below the threshold temperature.

In one configuration, performance of the handheld electronic device (100, 200) is reduced when temperature of the first surface (114, 214) and the second surface (112, 212) of the handheld electronic device (100, 200) is above the threshold temperature. The threshold temperature is 35 degree centigrade. The absorption of the liquid and evaporation of the liquid is performed by a temperature sensitive polymer with a surface property that switches from hydrophilic to hydrophobic at the threshold temperature. In an aspect, a cooling capacity provided by the evaporation of the liquid depends on an amount of water stored in a plurality of liquid retaining structures (236) in the second surface (112, 212) of the handheld electronic device (100, 200). Each liquid retaining structure (236) is coated with a temperature sensitive polymer with a surface property that switches from hydrophilic to hydrophobic at the threshold temperature. In one configuration, the handheld electronic device (100, 200) is one of a smart phone, a smart watch, a virtual reality device, a tablet. In another configuration, the temperature sensitive polymer is a combination of cotton and Poly(N-isopropylacrylamide) (PNIPAAm). In an aspect, the liquid is water.

In an aspect, a means for auxiliary cooling a handheld electronic device (100, 200) is provided. The means for cooling includes a means for distributing heat (110, 210) generated from at least one IC (102, 202, 104, 204) located between a first surface (114, 214) and a second surface (112, 212) and between a first side (122, 222) and a second side (124, 224) of the handheld electronic device (100, 200). The heat generated from the at least one IC (102, 202, 104, 204) is distributed across the second surface (112, 212) of the handheld electronic device (100, 200) to maintain temperature of the first surface (114, 214) and the second surface (112, 212) of the handheld electronic device (100, 200) below a threshold temperature. The means for distributing heat (110, 210) extends in a first direction between the first side (122, 222) and the second side (124, 224) of the handheld electronic device (100, 200). A first side of the means for distributing heat (110, 210) is adjacent to the second surface (112, 212) of the handheld electronic device (100, 200) and a second side of the means for distributing heat (110, 210) is in proximity to the at least one IC (102, 202, 104, 204). The means for cooling also includes evaporating liquid to an atmosphere surrounding the handheld electronic device (100, 200), when the temperature of the second surface (112, 212) of the handheld electronic device (100, 200) exceeds the threshold temperature. The liquid is evaporated to maintain the temperature of the first surface (114, 214) and the second surface (112, 212) of the handheld electronic device (100, 200) below the threshold temperature. The means for cooling further includes absorbing liquid from the atmosphere surrounding the handheld electronic device (100, 200) when the temperature of the second surface (112, 212) is at or below the threshold temperature.

In one configuration, performance of the handheld electronic device (100, 200) is reduced when temperature of the first surface (114, 214) and the second surface (112, 212) of the handheld electronic device (100, 200) is above the threshold temperature. The threshold temperature is 35 degree centigrade. The absorption of the liquid and evaporation of the liquid is performed by a temperature sensitive polymer with a surface property that switches from hydrophilic to hydrophobic at the threshold temperature. In an aspect, a cooling capacity provided by the means for evaporating liquid depends on an amount of water stored in a plurality of liquid retaining structures (236) in the second surface (112, 212) of the handheld electronic device (100, 200). Each liquid retaining structure (236) is coated with a temperature sensitive polymer with a surface property that switches from hydrophilic to hydrophobic at the threshold temperature. In one configuration, the handheld electronic device (100, 200) is one of a smart phone, a smart watch, a virtual reality device, a tablet. In another configuration, the temperature sensitive polymer is a combination of cotton and Poly(N-isopropylacrylamide) (PNIPAAm). In an aspect, the liquid is water.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An electronic device comprising:
   at least one integrated circuit (IC) located between a first surface and a second surface and between a first side and a second side of the electronic device; and
   an evaporative cooling mechanism comprising a plurality of liquid retaining structures located on the second surface of the electronic device, wherein:
      each liquid retaining structure of the plurality of liquid retaining structures comprises a temperature sensitive polymer;
      when the temperature of the second surface is below a threshold temperature, the temperature sensitive polymer is hydrophilic and absorbs liquid from an atmosphere surrounding the electronic device to store the absorbed liquid in the plurality of liquid retaining structures;
      when the temperature of the second surface exceeds the threshold temperature, the temperature sensitive polymer is hydrophobic and repels the liquid stored in the plurality of liquid retaining structures; and
      the evaporative cooling mechanism evaporates the liquid stored in the plurality of liquid retaining structures to the atmosphere surrounding the electronic device when the temperature of the second surface exceeds the threshold temperature.

2. The electronic device of claim 1, wherein:
   each of the plurality of liquid retaining structures is a channel that includes a bottom surface and two side surfaces separated from each other via the bottom surface;
   the bottom surface of the channel and adjoining portions of each of the two side surfaces of the channel are coated with the temperature sensitive polymer;
   at least the top tenth of each side surface of the channel is not coated with the temperature sensitive polymer.

3. The electronic device of claim 1, wherein the threshold temperature is 35 degree centigrade.

4. The electronic device of claim 2, wherein a cross-sectional dimension of the channel ranges from few microns to hundreds of microns.

5. The electronic device of claim 2, wherein one or more fins coated with the temperature sensitive polymer are attached to the bottom surface of the channel.

6. The electronic device of claim 1, wherein the electronic device is one of a smart phone, a smart watch, a virtual reality device, a tablet.

7. The electronic device of claim 1, wherein the temperature sensitive polymer is a combination of cotton and Poly(N-isopropylacrylamide) (PNIPAAm).

8. The electronic device of claim 1, wherein the liquid is water.

9. The electronic device of claim 1, wherein each of the plurality of liquid retaining structures is an open cylinder that includes a bottom surface and a side surface, wherein the bottom surface and a portion of the side surface of the open cylinder are coated with the temperature sensitive polymer.

10. The electronic device of claim 1, further comprising:
    a heat sink extending in a first direction between the first side and the second side of the electronic device, a first side of the heat sink is adjacent to the second surface of the electronic device and a second side of the heat sink is in proximity to the at least one IC, wherein the heat sink distributes heat generated from the at least one IC across the second surface of the electronic device.

11. The electronic device of claim 1, wherein:
    the plurality of liquid retaining structures extends in parallel to each other in a second direction perpendicular to a first direction; and
    the plurality of liquid retaining structures are located in proximity to the at least one IC.

12. A method of auxiliary cooling a portable electronic device comprising:
    distributing, by a heat sink, heat generated from at least one integrated circuit (IC) located between a first surface and a second surface and between a first side and a second side of the portable electronic device;
    evaporating liquid to an atmosphere surrounding the portable electronic device, when the temperature of the second surface of the portable electronic device exceeds a threshold temperature; and absorbing liquid from the atmosphere surrounding the portable electronic device when the temperature of the second surface is at or below the threshold temperature.

13. The method of claim 12, wherein performance of the portable electronic device is reduced when the temperature of the first surface and the second surface of the portable electronic device is above the threshold temperature.

14. The method of claim 12, wherein the threshold temperature is 35 degree centigrade.

15. The method of claim 12 wherein the absorption of the liquid and evaporation of the liquid is performed by a temperature sensitive polymer with a surface property that switches from hydrophilic to hydrophobic at the threshold temperature.

16. The method of claim 15, wherein the temperature sensitive polymer is a combination of cotton and Poly(N-isopropylacrylamide) (PNIPAAm).

17. The method of claim 12, wherein:
the second surface comprises a plurality of liquid-retaining structures; and
each liquid retaining structure is coated with a temperature sensitive polymer with a surface property that switches from hydrophilic to hydrophobic at the threshold temperature.

18. The method of claim 12, wherein the portable electronic device is one of a smart phone, a smart watch, a virtual reality device, a tablet.

19. The method of claim 12, wherein the liquid is water.

20. The method of claim 12, wherein:
heat generated from the at least one IC is distributed across the second surface of the portable electronic device; and
the heat sink extends in a first direction between the first side and the second side of the portable electronic device, a first side of the heat sink is adjacent to the second surface of the portable electronic device and a second side of the heat sink is in proximity to the at least one IC.

21. A portable electronic device comprising:
means for distributing heat generated from at least one integrated circuit (IC) located between a first surface and a second surface and between a first side and a second side of the portable electronic device;
means for evaporating liquid to an atmosphere surrounding the portable electronic device, when the temperature of the second surface of the portable electronic device exceeds a threshold temperature; and
means for absorbing liquid from the atmosphere surrounding the portable electronic device when the temperature of the second surface is at or below the threshold temperature.

22. The electronic device of claim 21, wherein performance of the portable electronic device is reduced when the temperature of the first surface and the second surface of the portable electronic device is above the threshold temperature.

23. The portable electronic device of claim 21, wherein the threshold temperature is 35 degree centigrade.

24. The portable electronic device of claim 21, wherein the means for absorbing liquid and the means for evaporating liquid further comprising a temperature sensitive polymer with a surface property that switches from hydrophilic to hydrophobic at the threshold temperature.

25. The portable electronic device of claim 24, wherein the temperature sensitive polymer is a combination of cotton and Poly(N-isopropylacrylamide) (PNIPAAm).

26. The portable electronic device of claim 21, wherein:
the second surface comprises a plurality of liquid-retaining structures; and
each liquid retaining structure is coated with a temperature sensitive polymer with a surface property that switches from hydrophilic to hydrophobic at the threshold temperature.

27. The portable electronic device of claim 21, wherein the portable electronic device is one of a smart phone, a smart watch, a virtual reality device, a tablet.

28. The portable electronic device of claim 21, wherein the liquid is water.

29. The portable electronic device of claim 21, wherein heat generated from the at least one IC is distributed across the second surface of the portable electronic device;
the means for distributing heat extending in a first direction between the first side and the second side of the portable electronic device;
a first side of the means for distributing heat is adjacent to the second surface of the portable electronic device; and
a second side of the means for distributing heat is in proximity to the at least one IC.

* * * * *